(12) United States Patent
Nogami

(10) Patent No.: US 7,465,652 B2  
(45) Date of Patent: Dec. 16, 2008

(54) METHOD OF FORMING A CATALYST LAYER ON THE BARRIER LAYER OF A CONDUCTIVE INTERCONNECT OF A SEMICONDUCTOR DEVICE

(75) Inventor: Takeshi Nogami, Hopewell Junction, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 243 days.

(21) Appl. No.: 11/204,701

(22) Filed: Aug. 16, 2005

(65) Prior Publication Data

US 2007/0042587 A1  Feb. 22, 2007

(51) Int. Cl.
 H01L 21/84 (2006.01)
(52) U.S. Cl. ............ 438/597; 438/629; 438/633; 438/638; 438/692; 257/E21.174; 257/E21.175; 257/E21.579; 257/E21.585
(58) Field of Classification Search ........ 438/597, 438/629, 633, 638, 687, 692; 257/E21.171, 257/E21.174, 175, 579, 583, 585
See application file for complete search history.

(56) References Cited

U.S. PATENT DOCUMENTS

| | | | | |
|---|---|---|---|---|
| 5,891,513 | A * | 4/1999 | Dubin et al. ............... | 438/633 |
| 6,555,457 | B1 * | 4/2003 | Derkits et al. ............... | 438/597 |
| 6,924,222 | B2 | 8/2005 | Goodner et al. ............... | 438/622 |
| 7,008,871 | B2 * | 3/2006 | Andricacos et al. ......... | 438/652 |
| 7,199,045 | B2 * | 4/2007 | Liu et al. ............... | 438/629 |
| 2001/0033509 | A1 | 10/2001 | Ahn et al. ............... | 365/63 |
| 2002/0064592 | A1 | 5/2002 | Datta et al. ............... | 427/98 |
| 2002/0081381 | A1 | 6/2002 | DelaRosa et al. ...... | 427/255.28 |
| 2003/0082845 | A1 | 5/2003 | Hoffman et al. ............... | 438/106 |
| 2003/0143837 | A1 | 7/2003 | Gandikota et al. ........... | 438/629 |
| 2003/0210103 | A1 | 11/2003 | Park et al. ............... | 333/1 |
| 2003/0218253 | A1 | 11/2003 | Avanzino et al. ............ | 257/758 |
| 2004/0005753 | A1 | 1/2004 | Kostamo et al. ............. | 438/222 |
| 2004/0094402 | A1 | 5/2004 | Gopalraja et al. ...... | 204/192.12 |
| 2004/0099952 | A1 | 5/2004 | Goodner et al. ............. | 257/758 |
| 2004/0102006 | A1 | 5/2004 | Xu et al. ............... | 438/259 |
| 2004/0113222 | A1 | 6/2004 | Ozguz et al. ............... | 257/459 |
| 2004/0130027 | A1 | 7/2004 | Chen et al. ............... | 257/758 |
| 2004/0161922 | A1 | 8/2004 | Gallagher et al. ............ | 438/623 |
| 2004/0185679 | A1 | 9/2004 | Ott et al. ............... | 438/781 |
| 2004/0207091 | A1 | 10/2004 | Wang et al. ............... | 257/758 |
| 2004/0253805 | A1 | 12/2004 | Dubin et al. ............... | 438/618 |
| 2005/0059234 | A1 | 3/2005 | Bera et al. ............... | 438/633 |
| 2005/0062034 | A1 | 3/2005 | Dubin ............... | 257/20 |
| 2005/0079706 | A1 | 4/2005 | Kumar et al. ............... | 438/638 |
| 2005/0088647 | A1 | 4/2005 | Shanmugasundram et al. ... | 356/72 |
| 2005/0093155 | A1 | 5/2005 | Kahlert et al. ............... | 257/751 |
| 2005/0110145 | A1 | 5/2005 | Elers ............... | 257/758 |
| 2005/0118807 | A1 | 6/2005 | Kim et al. ............... | 438/686 |

(Continued)

Primary Examiner—Michael S Lebentritt  
(74) Attorney, Agent, or Firm—Mayer & Williams PC; Stuart H. Mayer, Esq.; Karin L. Williams, Esq.

(57) ABSTRACT

A method is provided for depositing a conductive material in a sub-micron recessed feature formed on a substrate. The method begins by depositing a barrier layer over a dielectric layer disposed on the substrate while under a vacuum of the type found in a vacuum chamber. A catalytic layer is deposited over the barrier layer without breaking the vacuum. A conductive material layer is deposited over the catalytic layer by electroless deposition.

14 Claims, 1 Drawing Sheet

U.S. PATENT DOCUMENTS

2005/0139948 A1  6/2005  Chung et al. ................ 257/486
2005/0142853 A1  6/2005  Tu ............................. 438/624
2006/0051972 A1*  3/2006  Chen et al. .................. 438/763

* cited by examiner

METHOD OF FORMING A CATALYST LAYER ON THE BARRIER LAYER OF A CONDUCTIVE INTERCONNECT OF A SEMICONDUCTOR DEVICE

FIELD OF THE INVENTION

The present invention relates generally to semiconductor devices such as integrated circuits, and more particularly to a method of forming a conductive interconnect structure for an integrated circuit.

BACKGROUND OF THE INVENTION

The semiconductor industry has moved to using copper in various aspects of semiconductor devices due to certain advantages of copper over other metals. One advantage is that copper has a lower resistivity than aluminum, for instance. As a result, copper circuitry suffers less from resistance-capacitance (RC) delays. This makes copper systems faster. Further, copper has increased resistance to electromigration, thereby enabling smaller scaling of semiconductor devices. However, with increased use, certain problems particular to copper have become more prevalent. One such problem is that copper has a high diffusivity through dielectric and silicon materials on which the copper is deposited. This is especially the case for so-called low-K dielectric materials, which are coming into increasingly common usage. This is problematic because the presence of copper in these materials may be deleterious to these materials and lead to semiconductor device failure.

In conventional methodologies, a barrier material is typically deposited on the dielectric material between the copper layer and the dielectric (or silicon) material, thereby preventing the copper from diffusing into the dielectric or silicon material. Typically, tantalum (Ta) or titanium (Ti) based barrier materials (e.g., tantalum nitrides (TaN), tantalum silicon nitrides (TaSiN), or titanium nitrides (TiN)) are used as barrier layers for copper. Techniques such as atomic layer deposition (ALD) are often used to form the barrier layer. One problem with prior uses of tantalum nitride and other barrier layers, however, is that these barrier layers are poor wetting agents for the deposition of copper thereon which may cause numerous problems. For example, during deposition of a copper seed layer over these barrier layers, the seed layer may agglomerate and become discontinuous, which may prevent uniform deposition of a copper conductive material layer. Instead of a seed layer, a catalytic layer may be formed on the barrier layer so that an electroless plating process may be employed to form the copper layer. Similar to the copper seed layer, the catalytic layer may form discontinuously on the barrier layer, leading to formation of a less than satisfactory copper conductive layer. Thus, there is a need for an improved interconnect structure and method of depositing the interconnect structure.

SUMMARY OF THE INVENTION

In accordance with the present invention, a method is provided for depositing a conductive material in a sub-micron recessed feature formed on a substrate. The method begins by depositing a barrier layer over a dielectric layer disposed on the substrate while under a vacuum of the type found in a vacuum chamber. A catalytic layer is deposited over the barrier layer without breaking the vacuum. A conductive material layer is deposited over the catalytic layer by electroless deposition.

In accordance with one aspect of the invention, the barrier layer comprises an element or compound selected from the group consisting of tantalum (Ta), tantalum nitride ($TaN_x$), titanium (Ti), titanium nitride ($TiN_x$), tungsten (W), tungsten nitride ($WN_x$), and combinations thereof.

In accordance with another aspect of the invention, the barrier layer comprises tantalum (Ta).

In accordance with another aspect of the invention, the catalytic layer comprises an element selected from the group consisting of Pd, Pt, Ru, Rh, Au, Ag, Co, and Ni.

In accordance with another aspect of the invention, the catalytic layer comprises Pd.

In accordance with another aspect of the invention, the catalytic layer comprises Ru.

In accordance with another aspect of the invention, the barrier layer is deposited by physical vapor deposition.

In accordance with another aspect of the invention, the barrier layer is deposited by physical vapor deposition.

In accordance with another aspect of the invention, the catalytic layer is deposited by atomic layer deposition.

In accordance with another aspect of the invention, the catalytic layer is deposited by atomic layer deposition.

In accordance with another aspect of the invention, the conductive material layer comprises Cu.

In accordance with another aspect of the invention, the depositing steps are performed in accordance with a dual damascene process.

In accordance with another aspect of the invention, the recessed feature comprises a dual damascene interconnect structure.

DETAILED DESCRIPTION

Figure 1:
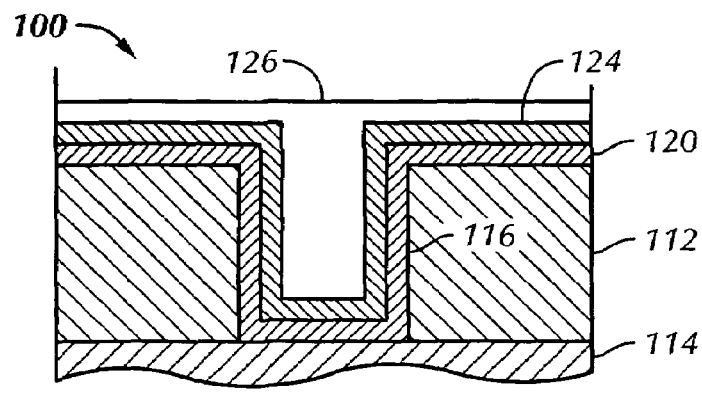
FIG. 1 shows a schematic cross-sectional view of one embodiment of a substrate structure formed in accordance with the principles of the present invention.

FIG. 1 shows a schematic cross-sectional view of a substrate structure 100 formed on a substrate 114. The substrate 114 refers to any workpiece upon which film processing is performed. For example, the substrate 114 may be a silicon semiconductor wafer, or other material layer, which has been formed on the wafer. A dielectric layer 112 is deposited over the substrate. The dielectric layer 112 may be an oxide, a silicon oxide, carbon-silicon-oxide, a fluoro-silicon, a porous dielectric, or other suitable dielectric. The dielectric layer 112 is patterned to provide a recessed feature 116, such as a via, trench, contact hole, or line extending to an exposed surface portion of the substrate 114. It is also understood by those with skill in the art that the present invention may be used in a dual damascene process flow.

A barrier layer 120 is formed over the substrate structure 100 and a catalytic layer 124 is formed over the barrier layer 120. The remainder of the recessed feature 116 is filled with a conductive material layer 126. The conductive material layer 126, typically copper, is deposited by electroless deposition.

The barrier layer 120 is deposited to prevent or inhibit diffusion of subsequently deposited materials over the barrier layer into the underlying substrate or dielectric layers. Examples of barrier layer materials include refractory metals and refractory metal nitrides such as tantalum (Ta), tantalum nitride (TaN$_x$), titanium (Ti), titanium nitride (TiN$_x$), tungsten (W), tungsten nitride (WN$_x$), and combinations thereof. Other examples of barrier layer materials include doped silicon, aluminum, aluminum oxides, titanium silicon nitride, tungsten silicon nitride, and combinations thereof. The barrier layer 120 may be deposited by chemical vapor deposition (CVD), physical vapor deposition (PVD), electroless deposition techniques, sputtering, or atomic layer deposition (ALD). The barrier layer 120 may also be a multi-layered film deposited individually or sequentially by the same or by a combination of techniques. Barrier thicknesses of 10 to 50 nm are typical.

In order to deposit the conductive material layer 126 by electroless metal plating, catalytic layer 124 is required. Electroless metal plating is an autocatalytic (non-electrolytic) method of deposition from solution. The electrons required for the metal reduction are supplied by the simultaneous oxidation of a reducing agent on the catalytic surface and reduction of metal ions. Plating is initiated on a catalyzed surface and is sustained by the catalytic nature of the plated metal surface itself. Electroless deposition typically involves exposing a substrate to a solution by immersing the substrate in a bath or by spraying the solution over the substrate.

With respect to the catalyzation of an electroless Cu deposition, this reaction takes place on a layer which has the catalytic properties to invoke the initial oxidation reaction of the reducing agent. Pd, Pt, Ru, Rh, Au, Ag, Co, and Ni are catalytic surfaces for oxidation of a reducing agent. In the illustrative embodiments described herein, Pd is used as the catalytic layer. Pd can be deposited on the barrier layer 120 by a variety of techniques, including CVD, PVD, sputtering, ion cluster beam deposition and ALD. The Pd layer is preferably as thin as possible to minimize the overall resistance of the structure. Such a Pd layer is typically less than about 10 nm in thickness. In the illustrative embodiments described herein, the Pd layer is nominally 5 nm thick.

Figure 2:
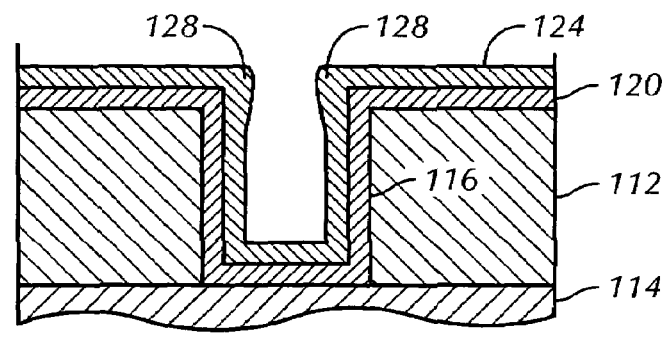
FIG. 2 shows a schematic cross-sectional view of a substrate structure in which the Pd catalyst layer is formed by physical vapor deposition (PVD).

Formation of a Pd catalyst layer on the barrier layer is sometimes problematic. For example, when PVD is used to form the Pd layer, excess Pd can accumulate at the entrance to the recess, narrowing the entrance and thereby hampering the subsequent formation of the conductive layer. This occurs because PVD employs a target which is composed of the metal to be sputter deposited and which is powered by a DC electrical source. A magnetron is scanned about the back of the target and projects its magnetic field into the portion of the reactor adjacent the target to increase the plasma density there to thereby increase the sputtering rate. As a result of this arrangement, PVD tends to sputter atoms into a wide angular distribution, typically having a cosine dependence about the target normal. Such a wide distribution can be disadvantageous for filling a deep and narrow (e.g., submicron) recessed feature (e.g., a via) such as that illustrated in FIG. 2, in which a barrier layer 120 has already been deposited. In FIGS. 1 and 2 like reference numerals are used to denote like elements. The large number of off-angle sputter particles can cause catalytic layer 124 to preferentially deposit around the upper corners of the recessed feature 116 and form overhangs 128. Large overhangs can further restrict entry into the recessed feature 116 and cause inadequate coverage of the sidewalls and bottom of the recess 116. Also, the overhangs 128 can bridge the recess entrance before it is filled and create a void in the metallization within the recess 116. Once a void has formed, it is often difficult to reflow it out by heating the metallization to near its melting point. Even a small void can introduce reliability problems. The bridged overhangs make subsequent deposition of the conductive layer more difficult.

Another example of a problem that can arise when the Pd catalyst layer is formed on the barrier layer occurs when ionized cluster beam deposition is used to form the Pd layer. In this case the Pd layer forms in islands, providing boundaries with discontinuous coverage over the barrier layer. When copper is electrolessly deposited on such a Pd layer, the electroless plating process is discontinuous at its nucleation step, resulting in a copper interconnect that does not have the electromigration resistance required in modern ULSI interconnects.

The present inventor has recognized that one of the problems that arises in conventional processes used to form the Pd catalytic layer is that prior to formation of the catalytic layer, the barrier layer on which the catalytic layer is formed can readily oxidize. For instance, if the barrier layer is formed from tantalum, tantalum oxide can form on the surface of the barrier layer. The oxide provides a site for void nucleation, leading to a discontinuous catalyst surface.

To reduce the formation of oxide, in the present invention the catalyst layer (e.g., Pd) is formed in the same vacuum system as the barrier layer without breaking the vacuum so that the barrier surface is not exposed to atmospheric pressure. This will generally require formation of the barrier layer in one chamber by PVD, sputtering, ALD, or the like, while the catalyst layer is formed in a second chamber, preferably by a technique such as ALD.

The atomic layer deposition (ALD) method of depositing thin films has several attractive features including excellent step coverage and a dense and pinhole-free structure. Therefore, it is of great interest to apply ALD to the deposition of metallization layers of advanced integrated circuits (ICs), where the continuously increasing packing density and aspect ratio set higher and higher demands upon the metallization layers. Moreover, ALD is well suited for fabricating thin layers requiring precision-controlled nanoscale film thickness. ALD is a type of chemical vapor deposition (CVD), wherein a film is built up through deposition of multiple ultrathin layers of atomic level controllability, with the thickness of the ultimate film being determined by the number of layers deposited. The source precursor is adsorbed in a self-limiting process on the substrate surface, followed by decomposition of this precursor to form a single molecular layer of the desired material. Decomposition may occur through reaction with an appropriately selected reagent. Thicker films are produced through repeated growth cycles until the target thickness is achieved. In an ALD process, the substrate with at least one surface to be coated, the source precursor, and any reactant(s), necessary for forming a desired product or layer are introduced into a deposition chamber. The precursor and reactant(s), both of which are typically in vapor or gaseous form, are pulsed sequentially into the deposition chamber with inert gas pulses in between the precursor and reactant pulses, for a specified, typically predetermined, short period of time, and allowed to react on the substrate surface to form an atomic layer of the desired thickness, typically on the scale of an atomic monolayer. The film thickness can be controlled to atomic layer (i.e., angstrom scale) accuracy by simply counting the number of deposition cycles.

In ALD, the source chemical molecules chemisorb on the substrate via active sites on the substrate surface. While physisorbed precursors are only weakly attached to the substrate, chemisorption results in a stronger, more desirable bond. Surface cleanliness is important for proper chemisorption, since impurities can occupy surface bonding sites. Incomplete chemisorption can lead to porous films, incomplete step coverage, poor adhesion between the deposited films and the underlying substrate, and low film density. For this reason, the barrier layer on which the catalyst layer is formed by ALD should have a high degree of cleanliness, which can be best obtained by forming both layers in the same vacuum system.

As those or ordinary skill in the art will recognize, precursor material for atomic layer deposition of Pd may be any of a variety of compounds such as compounds of Pd and Cl, Pd and Br, and various organic Pd compounds. Examples of suitable reactants that may be employed including $PdCl_2$ and $H_2$.

In some embodiments of the invention Ru may be used as the catalyst layer material. In this case, if ALD is used, the precursor material may be various Ru compounds such has $Ru(C_5H_5)_2$, for example, with reactants such as oxygen. Additional details concerning formation of Ru by ALD may be found, for example, in U.S. Patent App. No. 2005/0118807. In addition to serving as the catalyst layer, Ru can in some cases also serve as the barrier layer, thereby eliminating the need for a separate barrier and catalyst layer. However, in other cases it may be advantageous to use both a separate barrier layer material such as Ta and a Ru catalyst layer since Ta is generally a better barrier material than Ru.

Figure 3:
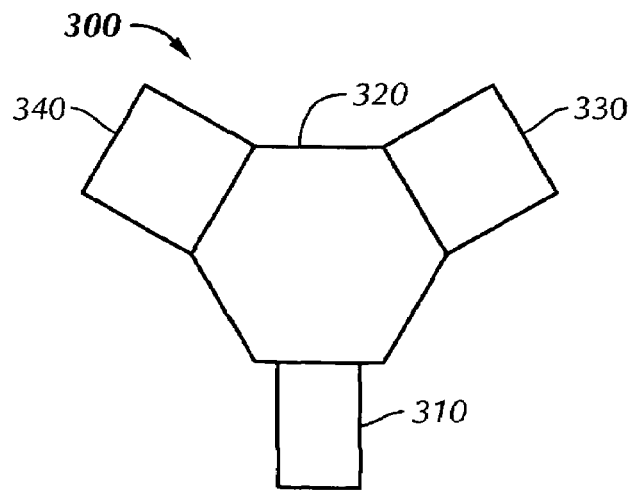
FIG. 3 is a schematic top-view diagram of one example of a multi-chamber processing system that may be used to produce the structure depicted in FIG. 1.

FIG. 3 is a schematic top-view diagram of one example of a multi-chamber processing system 300 that may be used to perform the processes disclosed herein. The particular embodiment of the system 300 is provided to illustrate the invention and should not be used to limit the scope of the invention.

The system 300 generally includes a load lock chamber 310 for the transfer of substrates into and out from the system 300. Typically, since the system 300 is under vacuum, the load lock chamber 310 may "pump down" the substrates introduced into the system 300. An automated transfer apparatus located in a transfer station 320 may transfer the substrates between the load lock chamber 310 and processing chambers 330 and 340.

In one embodiment, the system 300 is configured so that processing chamber 330 is adapted to deposit a barrier layer. For example, the processing chamber 330 for depositing the barrier layer may be a physical vapor deposition chamber, a chemical vapor deposition chamber, or an atomic layer deposition chamber. The system 300 may be further configured so that processing chamber 340 is adapted to deposit a catalytic layer. For example, the processing chamber 340 for depositing the barrier layer may be an atomic layer deposition chamber, a chemical vapor deposition chamber, or a physical vapor deposition chamber. In one specific embodiment, the processing chamber 340 may be an atomic layer deposition chamber for the deposition of a Pd catalyst layer and the processing chamber 330 may be a physical vapor deposition chamber for the deposition of a Ta barrier layer.

The invention claimed is:

1. A method of depositing a conductive material in a submicron recessed feature formed on a substrate, comprising:
   depositing a barrier layer over a dielectric layer disposed on the substrate while under a vacuum of the type found in a vacuum chamber;
   depositing a catalytic layer over the barrier layer without breaking the vacuum; and
   depositing a conductive material layer over the catalytic layer by electroless deposition.

2. The method of claim 1 wherein the barrier layer comprises an element or compound selected from the group consisting of tantalum (Ta), tantalum nitride ($TaN_x$), titanium (Ti), titanium nitride ($TiN_x$), tungsten (W), tungsten nitride ($WN_x$), and combinations thereof.

3. The method of claim 1 wherein the barrier layer comprises tantalum (Ta).

4. The method of claim 1 wherein the catalytic layer comprises an element selected from the group consisting of Pd, Pt, Ru, Rh, Au, Ag, Co, and Ni.

5. The method of claim 1 wherein the catalytic layer comprises Pd.

6. The method of claim 1 wherein the catalytic layer comprises Ru.

7. The method of claim 1 wherein the hairier layer is deposited by physical vapor deposition.

8. The method of claim 3 wherein the barrier layer is deposited by physical vapor deposition.

9. The method of claim 1 wherein the catalytic layer is deposited by atomic layer deposition.

10. The method of claim 5 wherein the catalytic layer is deposited by atomic layer deposition.

11. The method of claim 8 wherein the catalytic layer is deposited by atomic layer deposition.

12. The method of claim 1 wherein said conductive material layer comprises Cu.

13. The method of claim 1 wherein said depositing steps are performed in accordance with a dual damascene process.

14. The method of claim 1 wherein said recessed feature comprises a dual damascene interconnect structure.

* * * * *

UNITED STATES PATENT AND TRADEMARK OFFICE
CERTIFICATE OF CORRECTION

PATENT NO. : 7,465,652 B2  Page 1 of 1
APPLICATION NO. : 11/204701
DATED : December 16, 2008
INVENTOR(S) : Takeshi Nogami It is certified that error appears in the above-identified patent and that said Letters Patent is hereby corrected as shown below:

Specification, Col. 2, delete lines 17-20, which repeat lines 15, 16, 21 and 22.

Specification, Col. 5, line 6, after "those", change "or" to --of--.

Specification, Col. 5, line 14, after last word "such", change "has" to --as--.

Claim 7, Col. 6, line 30, before "layer", change "hairier" to --barrier--.

Signed and Sealed this

Twenty-first Day of April, 2009

JOHN DOLL
*Acting Director of the United States Patent and Trademark Office*